(12) United States Patent
Fei et al.

(10) Patent No.: US 10,687,398 B2
(45) Date of Patent: Jun. 16, 2020

(54) METHOD AND DEVICE FOR ALL-DIRECTIONAL INDUCTION STEPLESS DIMMING OF LED LAMP

(71) Applicant: DONGGUAN BANGDA HARDWARE CO., LTD., Dongguan (CN)

(72) Inventors: Yelong Fei, Dongguan (CN); Haifu Zou, Dongguan (CN); Enwang Liao, Dongguan (CN); Hang Nie, Dongguan (CN); Junyun Liao, Dongguan (CN)

(73) Assignee: DONGGUAN BANGDA HARDWARE CO., LTD., Dongguan, Guangdong (CN)

( * ) Notice: Subject to any disclaimer, the term of this patent is extended or adjusted under 35 U.S.C. 154(b) by 0 days.

(21) Appl. No.: 16/318,105

(22) PCT Filed: Jun. 13, 2017

(86) PCT No.: PCT/CN2017/088094
§ 371 (c)(1),
(2) Date: Jan. 15, 2019

(87) PCT Pub. No.: WO2018/028297
PCT Pub. Date: Feb. 15, 2018

(65) Prior Publication Data
US 2019/0373698 A1    Dec. 5, 2019

(30) Foreign Application Priority Data

Aug. 10, 2016 (CN) .......................... 2016 1 0650676

(51) Int. Cl.
*H05B 45/10* (2020.01)
*H03K 7/08* (2006.01)

(52) U.S. Cl.
CPC ............... *H05B 45/10* (2020.01); *H03K 7/08* (2013.01)

(58) Field of Classification Search
CPC ....... H05B 33/0854; H05B 33/08; H03K 7/08
See application file for complete search history.

(56) References Cited

U.S. PATENT DOCUMENTS

| 2014/0152183 A1* | 6/2014 | Kim ................... H05B 33/0809 315/155 |
| 2016/0105939 A1* | 4/2016 | Lee .................... H05B 33/0845 315/201 |
| 2018/0279429 A1* | 9/2018 | Sadwick ................ H05B 33/08 |

FOREIGN PATENT DOCUMENTS

| CN | 202303100 U | 7/2012 |
| CN | 104981052 A | 10/2015 |

(Continued)

*Primary Examiner* — Daniel D Chang
(74) *Attorney, Agent, or Firm* — Sinorica, LLC (57) ABSTRACT

The invention provides a method and device for all-directional induction stepless dimming of an LED lamp. The device comprises an LED lamp power supply main circuit internally provided with a dimming control unit and a primary side main control unit and a human body induction unit used to introduce human body induction signals into a control chip. A PWM duty cycle signal is output by the control chip and is finally transmitted to a source of a field effect transistor Q6 to drive an oscillation transformer T1 to generate an alternating voltage, and a driving voltage is output to an LED lamp after rectification filter. Compared with the prior art, people approaching in two very opposite directions can be monitored at the same time, the brightness of the lamp is adjusted by adjusting the PWM duty cycle on the primary side of a power supply.

10 Claims, 4 Drawing Sheets

(56) References Cited

FOREIGN PATENT DOCUMENTS

| CN | 106304468 A | 1/2017 |
|---|---|---|
| CN | 206042429 U | 3/2017 |

\* cited by examiner

METHOD AND DEVICE FOR ALL-DIRECTIONAL INDUCTION STEPLESS DIMMING OF LED LAMP

BACKGROUND OF THE INVENTION

1. Technical Field

The invention relates to LED illumination technologies, in particular to a power technology for LED illumination, and particularly discloses a method and device for all-directional induction stepless dimming of an LED lamp.

2. Description of Related Art

At present, with the increasing popularization of LED illumination technologies, LED illumination lamps capable of saving power and long in service life are replacing other lamps on a large scale and have been used all over the world.

However, most existing night lamps used in streets and courtyards for illumination can detect people approaching in only one direction and only have a high brightness level or a low brightness level.

For instance, Comparative Document 1: Chinese Invention Patent Application No. 201110201785.5 discloses a two-order light-emitting diode safety monitoring illumination device. However, this technical solution has the following drawbacks.

First, people approaching in two very opposite directions cannot be monitored at the same time.

Second, the brightness can only be adjusted to a 'bright' level or a 'dark' level instead of being steplessly adjusted.

Third, lamps can neither be completely turned off in the daytime nor be completed turned on at night.

Fourth, the efficiency is low because the brightness of lamps is adjusted by shorting part of LED illumination lamps near the load.

Fifth, the configuration is inflexible due to the lack of a splicing design.

Thus, in order to overcome these drawbacks, this technical solution needs to be improved on many aspects.

BRIEF SUMMARY OF THE INVENTION

In order to solve the problems of the prior art that people approaching in two very opposite directions cannot be monitored at the same time, that the brightness can only be adjusted to a 'bright' level or a 'dark' level instead of being steplessly adjusted, that lamps can neither be completely turned off in the daytime nor be completed turned on at night, that the efficiency is low because the brightness of lamps is adjusted by shorting part of LED illumination lamps near the load and that the configuration is inflexible due to the lack of a splicing design, the invention provides a technical solution for all-directional induction stepless dimming of an LED lamp.

The invention is implemented based on the following technical solution: A method for all-directional induction stepless dimming of an LED lamp is provided and comprises the following steps:

A. preparing a human body induction unit for an LED lamp power supply main circuit, wherein a first human body induction device PIR1 and a second human body induction device PIR2 are arranged in the human body induction unit and are used to combine induction signals in two directions and then to transmit a composite induction signal to a terminal VSS2;

B. configuring a dimming control unit on a secondary side of the LED lamp power supply main circuit, wherein the dimming control unit is used to introduce and transmit the signal from the terminal VSS2 of the human body induction unit to one pin of a control chip U4;

C. outputting a PWM duty cycle signal by one pin of the control chip U4 in the dimming control unit and transmitting, by a current-limiting resistor R73, the PWM duty cycle signal to an anode of a light-emitting device of a photoelectric coupler U2;

D. inputting, by a photosensitive device of the photoelectric coupler U2, the PWM duty cycle signal to a terminal DIM of a main control chip U1 in a primary side main control unit of the LED lamp power supply main circuit; and E. driving, by the main control chip U1, a field effect transistor Q6 to work according to the PWM duty cycle signal input to the main control chip U1, generating an alternating voltage by an oscillation transformer T1, carrying out rectification filter by a crystal diode D6 and an electrolytic capacitor C14, and outputting a driving voltage to the LED lamp.

In Step A, the composite induction signal transmitted to the terminal VSS2 after being obtained by combining the induction signals in two directions by the first human body induction device PIR1 and the second human body induction device PIR2 is an analog voltage signal and is formed in such a manner: the induction signal of the first human body induction device PIR1 is output from a collector after being amplified by a first transistor Q1 and is then added to a base of a third transistor Q3 through a capacitor C9, and the induction signal of the second human body induction device PIR2 is output from the collector after being amplified by a second transistor Q2 and is then also added to the base of the third transistor Q3 through a capacitor C10 to be superimposed on the induction signal of the first human body induction device PIR1.

In Step B, the signal from the terminal VSS2 of the human body induction unit is introduced and transmitted by the dimming control unit to one pin of the control chip U4 in such a manner: an A/D conversion unit is arranged in the control chip U4 to convert the analog voltage signal into a digital signal, the digital signal is then transmitted to a PWM duty cycle signal generation unit, and then different PWM duty cycle signals are output according to different digital voltages.

In Step C, a signal from a light-control device PT1 is input to one pin of the control chip U4, and a threshold is set to judge whether it is daytime or nighttime; one pin of the control chip U4 controls a gate of a transistor Q4; the transistor Q4 is turned on when an illumination lamp needs to be turned on in a night mode; and the transistor Q4 is turned off in a daytime mode.

In Step A, the human body induction unit is an independent module, and in this case, external ports VDD2, CDS2, VSS2, GND2 and LED2 of the human body induction unit respectively correspond to ports VDD1, CDS1, VSS1, GND1 and LED1 of the LED lamp power supply main circuit; or the human body induction unit and the LED lamp power supply main circuit are integrated, and in this case, VDD2 is directly connected with VDD1, CDS2 is directly connected with CDS1, VSS2 is directly connected with VSS1, GND2 is directly connected with GND1, and LED2 is directly connected with LED1.

To implement the method mentioned above, a device for all-directional induction stepless dimming of an LED lamp is designed and manufactured. The device comprises:

an LED lamp power supply main circuit, wherein the LED lamp power supply main circuit comprises a dimming control unit and a primary side main control unit; and a human body induction unit, wherein a first human body induction device PIR1 and a second human body induction device PIR2 are arranged in the human body induction unit and are used to combine induction signals in two directions and then to transmit a composite induction signal to a terminal VSS2.

The dimming control unit is used to introduce and transmit the signal from the terminal VSS2 of the human body induction unit to one pin of a control chip U4.

Another pin of the control chip U4 outputs a PWM duty cycle signal which is then transmitted to an anode of a light-emitting device of a photoelectric coupler U2 by a current-limiting resistor R73.

A photosensitive device of the photoelectric coupler U2 transmits the PWM duty cycle signal to a terminal DIM of a main control chip U1 in the primary side main control unit of the LED lamp power supply main circuit.

A GATE pin of the main control chip U1 is connected to a gate of a field effect transistor Q6 to drive an oscillation transformer T1 to generate an alternating voltage, then rectification filter is carried out by a crystal diode D6 and an electrolytic capacitor C14, and a driving voltage is output to the LED lamp.

The induction signal of the first human body induction device PIR1 is output from a collector after being amplified by a first transistor Q1 and is then added to a base of a third transistor Q3 through a capacitor C9.

The induction signal of the second human body induction device PIR2 is output from the collector after being amplified by a second transistor Q2 and is then added to the base of the third transistor Q3 through a capacitor C10 to be superimposed on the induction signal of the first human body induction signal PIR1.

The dimming control unit outputs and transmits the signal from the terminal VSS2 of the human body induction unit to one pin of the control chip U4, an A/D conversion unit in the control chip U4 converts an analog voltage signal into a digital signal and then transmits the digital signal to a PWM duty cycle signal generation unit in the control chip U4, and the PWM duty cycle signal generation unit outputs different PWM duty cycle signals.

A signal from a light-control device PT1 is input to another pin of the control chip U4, and a voltage comparator is arranged in the control chip U4; a threshold is set; an output of the voltage comparator is connected to a gate of a transistor Q4; the transistor Q4 is turned on when the illumination lamp needs to be turned on in a night mode; and the transistor Q4 is turned off in a daytime mode.

The human body induction unit is an independent module, and in this case, external ports VDD2, CDS2, VSS2, GND2 and LED2 of the human body induction unit respectively correspond to ports VDD1, CDS1, VSS1, GND1 and LED1 of the LED lamp power supply main circuit; or the human body induction unit (10) and the LED lamp power supply main circuit are integrated, and in this case, VDD2 is directly connected with VDD1, CDS2 is directly connected with CDS1, VSS2 is directly connected with VSS1, GND2 is directly connected with GND1, and LED2 is directly connected with LED1.

Compared with the prior art, the method and device for all-directional induction stepless dimming of an LED lamp have the following advantages: people approaching in two very opposite directions can be monitored at the same time, the brightness can be steplessly adjusted from a 'dark' level to a 'bright' level; the lamp can be completely turned off in the daytime and be completely turned on at night; the brightness of the lamp is adjusted by adjusting the PWM duty cycle on the primary side of a power supply, so that the efficiency is high; and the configuration is flexible by adoption of a splicing design.

DETAILED DESCRIPTION OF THE INVENTION

To further expound the method of the invention, preferred embodiments of the invention are detailed below with reference to the accompanying drawings. However, the preferred embodiments in the following description are only used for illustration and explanation, but are not intended to limit the patent protection scope of the invention.

As shown in FIG. 1 and FIG. 2 and FIG. 3 and FIG. 4, a method for all-directional induction stepless dimming of an LED lamp is implemented. The method comprises the following steps:

A. first, a human body induction unit 10 is prepared for an LED lamp light supply main circuit, wherein a first human body induction device PIR1 and a second human body induction device PIR2 are arranged in the human body induction unit 10 and are used to combine induction signals in two directions and then to transmit a composite induction signal to a terminal VSS2;

B. second, a dimming control unit 11 is configured on a secondary side of the LED lamp power supply main circuit, wherein the dimming control unit 11 introduces and transmits the signal from the terminal VSS2 of the human body induction unit 10 to one pin of the control chip U4;

C. third, one pin of the control chip U4 in the dimming control unit 11 outputs a PWM duty cycle signal which is then transmitted by a current-limiting resistor R73 to an anode of a light-emitting device of a photoelectric coupler U2;

D. afterwards, a photosensitive device of the photoelectric coupler U2 inputs the PWM duty cycle signal to a terminal DIM of a main control chip U1 in a primary side main control unit 12 of the LED lamp power supply main circuit; and E. finally, the main control chip U1 controls a field effect transistor Q6 to work according to the PWM duty cycle signal input to the main control chip U1, an oscillation transformer T1 generates an alternating voltage, and rectification filter is carried out by a crystal diode D6 and an electrolytic capacitor C14 to output a driving voltage to the LED lamp.

In Step A, the composite induction signal transmitted to the terminal VSS2 after being obtained by combining the induction signals in two directions by the first human body induction device PIR1 and the second human body induction device PIR2 is an analog voltage signal and is formed in such a manner: the induction signal of the first human body induction device PIR1 is output from a collector after being amplified by a first transistor Q1 and is then added to a base of a third transistor Q3 through a capacitor C9, and the induction signal of the second human body induction device PIR2 is output from the collector after being amplified by a second transistor Q2 and is then also added to the base of the third transistor Q3 through a capacitor C10 to be superimposed on the induction signal of the first human body induction device PIR1.

In Step B, the signal from the terminal VSS2 of the human body 10 induction unit is introduced and transmitted by the dimming control unit to one pin of the control chip U4 in such a manner: an A/D conversion unit is arranged in the control chip U4 to convert the analog voltage signal into a digital signal, the digital signal is then transmitted to a PWM duty cycle signal generation unit, and then different PWM duty cycle signals are output according to different digital voltages.

In Step C, a signal from a light-control device PT1 is input to one pin of the control chip U4, and a threshold is set to judge whether it is daytime or nighttime; one pin of the control chip U4 controls a gate of a transistor Q4; the transistor Q4 is turned on when an illumination lamp needs to be turned on in a night mode; and the transistor Q4 is turned off in a daytime mode.

In Step A, the human body induction unit 10 is an independent module, and in this case, external ports VDD2, CDS2, VSS2, GND2 and LED2 of the human body induction unit respectively correspond to ports VDD1, CDS1, VSS1, GND1 and LED1 of the LED lamp power supply main circuit; or the human body induction unit and the LED lamp power supply main circuit are integrated, and in this case, VDD2 is directly connected with VDD1, CDS2 is directly connected with CDS1, VSS2 is directly connected with VSS1, GND2 is directly connected with GND1, and LED2 is directly connected with LED1.

A device for all-directional induction stepless dimming of an LED lamp is designed and manufactured according to the method mentioned above. The device comprises:

an LED lamp power supply main circuit, wherein the LED lamp power supply main circuit comprises a dimming control unit 11 and a primary side main control unit 12; and a human body induction unit 10, wherein a first human body induction device PIR1 and a second human body induction device PIR2 are arranged in the human body induction unit 10 and are used to combine induction signals in two directions and then to transmit a composite induction signal to a terminal VSS2.

The dimming control unit 11 is used to introduce and transmit the signal from the terminal VSS2 of the human body induction unit 10 to one pin of a control chip U4.

Another pin of the control chip U4 outputs a PWM duty cycle signal which is then transmitted to an anode of a light-emitting device of a photoelectric coupler U2 by a current-limiting resistor R73.

A photosensitive device of the photoelectric coupler U2 transmits the PWM duty cycle signal to a terminal DIM of a main control chip U1 in the primary side main control unit 12 of the LED lamp power supply main circuit.

A GATE pin of the main control chip U1 is connected to a gate of a field effect transistor Q6 to drive an oscillation transformer T1 to generate an alternating voltage, then rectification filter is carried out by a crystal diode D6 and an electrolytic capacitor C14, and a driving voltage is output to the LED lamp.

The induction signal of the first human body induction device PIR1 is output from a collector after being amplified by a first transistor Q1 and is then added to a base of a third transistor Q3 through a capacitor C9.

The induction signal of the second human body induction device PIR2 is output from the collector after being amplified by a second transistor Q2 and is then added to the base of the third transistor Q3 through a capacitor C10 to be superimposed on the induction signal of the first human body induction signal PIR1.

Figure 3:
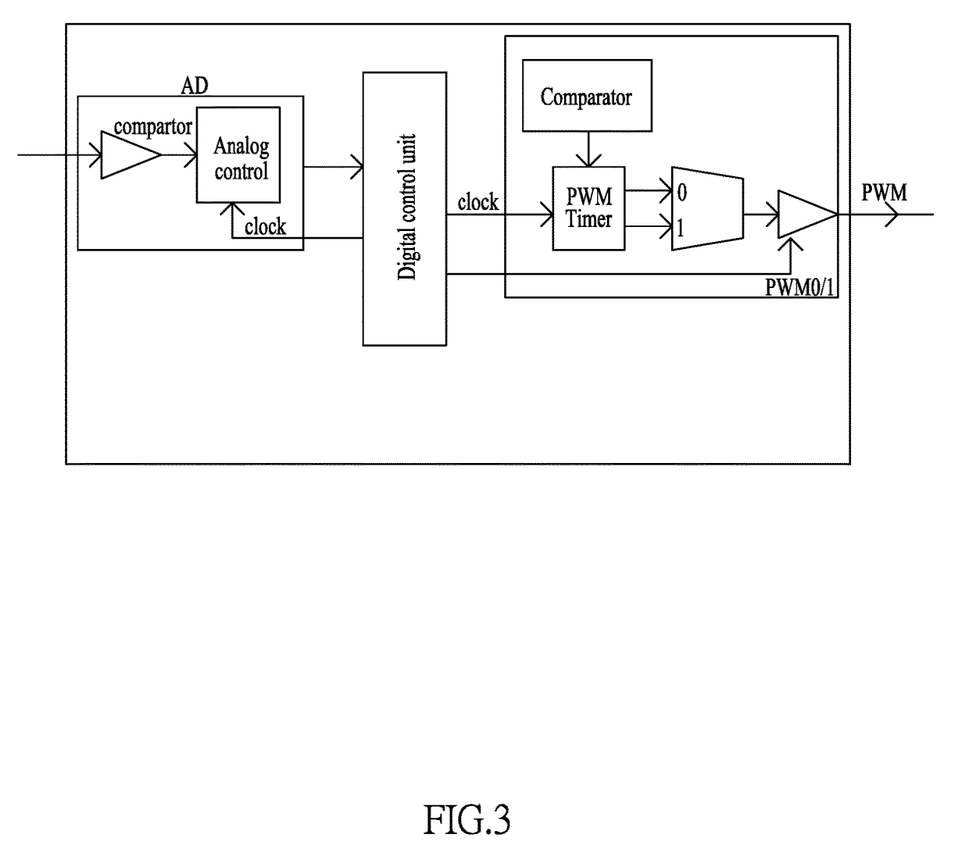
FIG. 3 is a diagram showing an A/D conversion unit of the invention.
Figure 4:
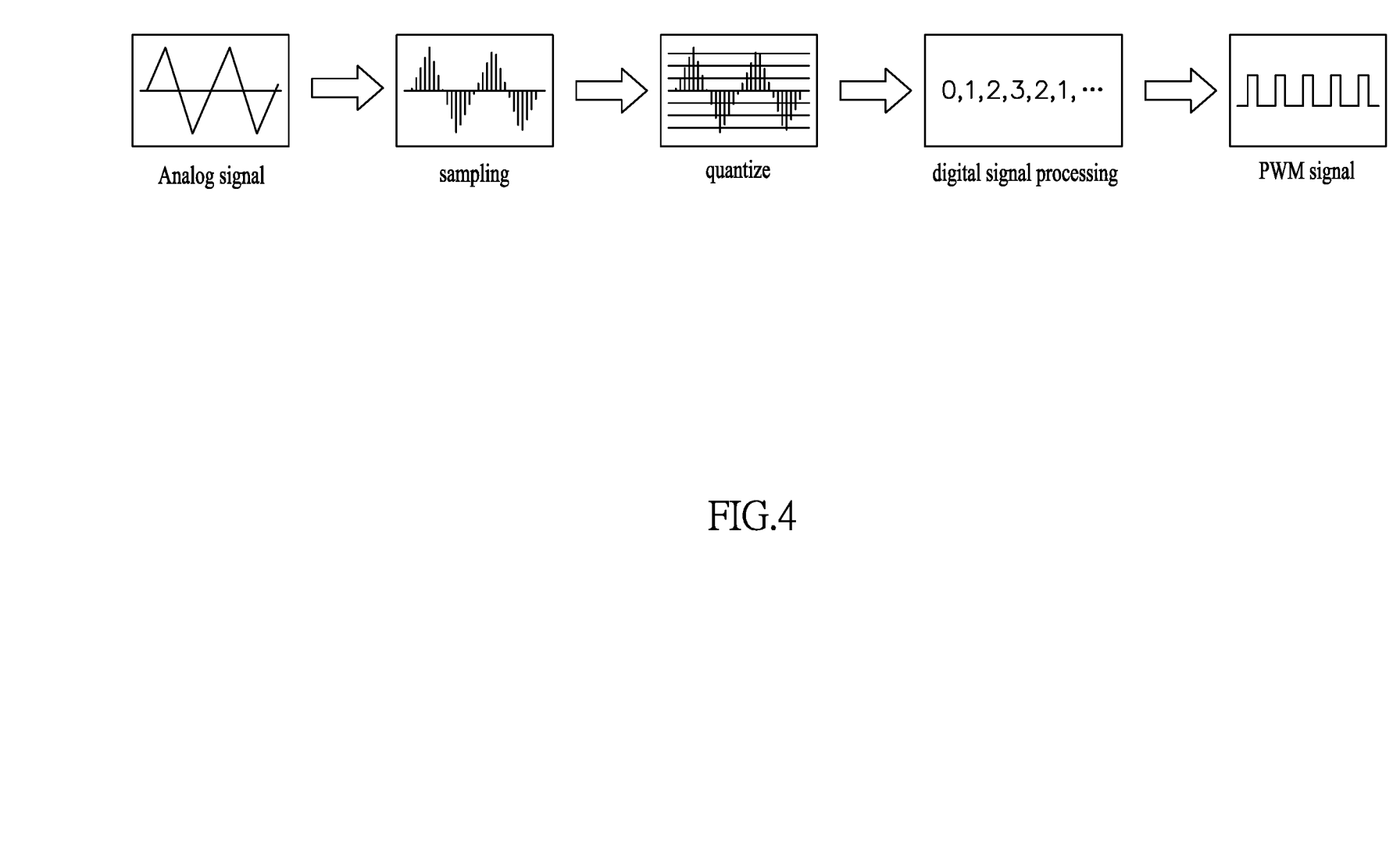
FIG. 4 is a diagram showing a PWM duty cycle signal generation unit of the invention.

The dimming control unit 11 outputs and transmits the signal from the terminal VSS2 of the human body induction unit to one pin of the control chip U4, an A/D conversion unit in the control chip U4 converts an analog voltage signal into a digital signal and then transmits the digital signal to a PWM duty cycle signal generation unit in the control chip U4, and the PWM duty cycle signal generation unit outputs different PWM duty cycle signals.

A signal from a light-control device PT1 is input to another pin of the control chip U4, and a voltage comparator is arranged in the control chip U4; a threshold is set; an output of the voltage comparator is connected to a gate of a transistor Q4; the transistor Q4 is turned on when an illumination lamp needs to be turned on in a night mode; and the transistor Q4 is turned off in a daytime mode.

The human body induction unit 10 is an independent module, and in this case, external ports VDD2, CDS2, VSS2, GND2 and LED2 of the human body induction unit respectively correspond to ports VDD1, CDS1, VSS1, GND1 and LED1 of the LED lamp power supply main circuit; or the human body induction unit 10 and the LED lamp power supply main circuit are integrated, and in this case, VDD2 is directly connected with VDD1, CDS2 is directly connected with CDS1, VSS2 is directly connected with VSS1, GND2 is directly connected with GND1, and LED2 is directly connected with LED1.

Figure 1:
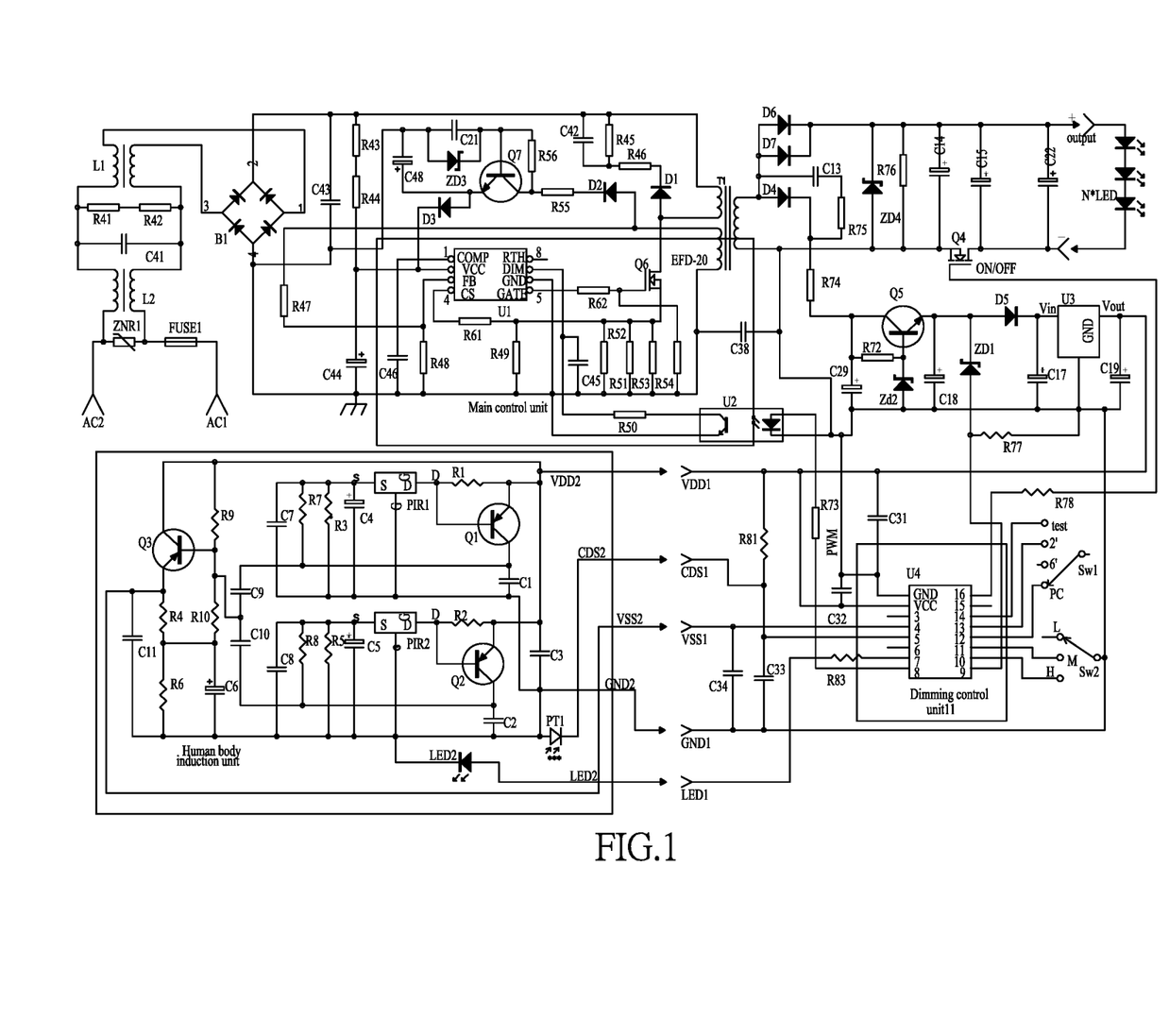
FIG. 1 is a principle diagram of a method and device for all-directional induction stepless dimming of an LED lamp of the invention.
Figure 2:
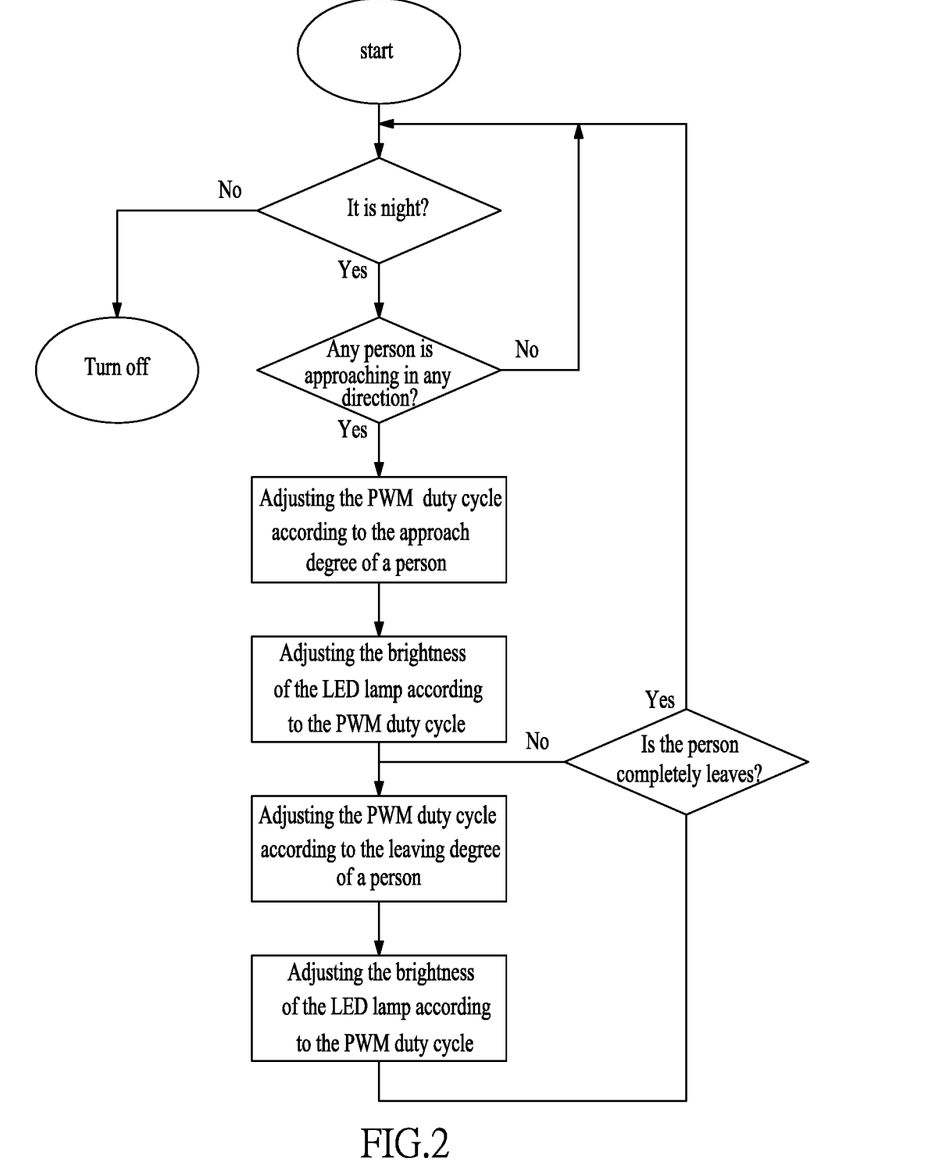
FIG. 2 is a control block diagram of the method and device for all-directional induction stepless dimming of an LED lamp of the invention.

As shown in FIG. 1, capacitors C15, C22 and C14 are connected in parallel, so that the capacity is improved.

A diode D7 and a diode D6 are connected in parallel, so that the load capacity is improved.

The control chip U4 is a common control chip, there are many chips internally provided with a PWM duty cycle signal generation unit and an A/D conversion unit, and these chips will not be enumerated herein.

The device can monitor people approaching in two very opposite directions at the same time and can also be provided with only one set of monitoring sensors to specifically monitor people approaching in one direction.

The device can also be provided with a plurality of sets of monitoring sensors to specifically monitor people approaching in multiple directions.

According to the technical solution of the invention, human body induction devices PIR are used as monitoring sensors, or microwave sensors are used as monitoring sensors, or ultrasonic sensor are used as monitoring sensors; and when microwave sensors and ultrasonic sensors are used, the circuit is slightly modified, and unnecessary details will not be given herein.

The method and device can steplessly adjust the brightness from a 'dark' level to a 'bright' level, thereby being suitable for various occasions.

The invention is expounded above with reference to the preferred embodiments, but specific implementations of the invention are not limited to the above description. For those ordinarily skilled in the technical field, various simple deductions or substitutes can be made without deviating from the conception of the invention, and all these deductions or substitutes should also fall within the protection scope of the invention.

What is claimed is:

1. A method for all-directional induction stepless dimming of an LED lamp, comprising the following steps:
   A. preparing a human body induction unit (10) for an LED lamp power supply main circuit, wherein a first human body induction device (PIR1) and a second human body induction device (PIR2) are arranged in the human body induction unit (10) and are used to combine induction signals in two directions and then to transmit a composite signal to a terminal (VSS2);
   B. configuring a dimming control unit (11) on a secondary side of the LED lamp power supply main circuit, wherein the dimming control unit (11) is used to introduce and transmit the composite signal from the terminal (VSS2) of the human body induction unit (10) to a first pin of a control chip (U4);
   C. outputting a PWM duty cycle signal by a second pin of the control chip (U4) in the dimming control unit (11) and then transmitting, by a current-limiting resistor (R73), the PWM duty cycle signal to an anode of a light-emitting device of a photoelectric coupler (U2);
   D. inputting, by a photosensitive device of the photoelectric coupler (U2), the PWM duty cycle signal to a first pin (DIM) of a main control chip (U1) in a primary side of a main control unit (12) of the LED lamp power supply main circuit; and
   E. driving, by the main control chip (U1), a field effect transistor (Q6) to work according to the PWM duty cycle signal input to the main control chip (U1), generating an alternating voltage by an oscillation transformer (T1), carrying out rectification filter by a crystal diode (D6) and an electrolytic capacitor (C14), and outputting a driving voltage to the LED lamp.

2. The method according to claim 1, wherein:
   in Step A, the composite induction signal transmitted to the terminal (VSS2) after being obtained by combining the induction signals in two directions by the first human body induction device (PIR1) and the second human body induction device (PIR2) is an analog voltage signal and is formed in such a manner: an induction signal of the first human body induction device (PIR1) is output from a collector after being amplified by a first transistor (Q1) and is then added to a base of a third transistor (Q3) through a capacitor (C9), and an induction signal of the second human body induction device (PIR2) is output from the collector after being amplified by a second transistor (Q2) and is then also added to the base of the third transistor (Q3) through a capacitor (C10) to be superimposed on the induction signal of the first human body induction device (PIR1).

3. The method according to claim 1, wherein:
   in Step B, the composite signal from the terminal (VSS2) of the human body induction unit (10) is introduced and transmitted by the dimming control unit (11) to the first pin of the control chip (U4) in such a manner: an A/D conversion unit is arranged in the control chip (U4) to convert an analog voltage signal into a digital signal, the digital signal is then transmitted to a PWM duty cycle signal generation unit, and then different PWM duty cycle signals are output according to different digital voltages.

4. The method according to claim 1, wherein:
   in Step C, a signal from a light-control device (PT1) is input to a third pin of the control chip (U4), and a threshold is set to judge whether it is daytime or nighttime; the third pin of the control chip (U4) controls a gate of a transistor (Q4); the transistor (Q4) is turned on when the LED lamp needs to be turned on in a night mode; and the transistor (Q4) is turned off in a daytime mode.

5. The method according to claim 1, wherein:
   in Step A, the human body induction unit (10) is an independent module, and in this case, a second terminal (VDD2), a third terminal (CDS2), the terminal (VSS2), a fourth terminal (GND2) and a fifth terminal (LED2) of the human body induction unit (10) respectively correspond to a sixth terminal (VDD1), a seventh terminal (CDS1), an eighth terminal (VSS1), a ninth terminal (GND1) and a tenth terminal (LED1) of the LED lamp power supply main circuit; or the human body induction unit (10) and the LED lamp power supply main circuit are integrated, and in this case, (VDD2) is directly connected with (VDD1), (CDS2) is directly connected with (CDS1), (VSS2) is directly connected with (VSS1), (GND2) is directly connected with (GND1), and (LED2) is directly connected with (LED1).

6. A device for all-directional induction stepless dimming of an LED lamp, comprising:
   an LED lamp power supply main circuit, wherein the LED lamp power supply main circuit comprises a dimming control unit (11) and a primary side main control unit (12); and
   a human body induction unit (10), wherein a first human body induction device (PIR1) and a second human body induction device (PIR2) are arranged in the human body induction unit (10) and are used to combine induction signals in two directions and then to transmit a composite signal to a terminal (VSS2); wherein:
   the dimming control unit (11) is used to introduce and transmit the composite signal from the terminal (VSS2) of the human body induction unit (10) to a first pin of a control chip (U4);
   a second pin of the control chip (U4) outputs a PWM duty cycle signal which is then transmitted by a current-limiting resistor (R73) to an anode of a light-emitting device of a photoelectric coupler (U2);
   a photosensitive device of the photoelectric coupler (U2) transmits the PWM duty cycle signal to a first pin (DIM) of a main control chip (U1) in the primary side main control unit (12) of the LED lamp power supply main circuit;
   a second pin (GATE) pin of the main control chip (U1) is connected to a gate of a field effect transistor (Q6) to drive an oscillation transformer (T1) to generate an alternating voltage, then rectification filter is carried out by a crystal diode (D6) and an electrolytic capacitor (C14), and a driving voltage is output to the LED lamp.

7. The device according to claim 6, wherein an induction signal of the first human body induction device (PIR1) is output from a collector after being amplified by a first transistor (Q1) and is then added to a base of a third transistor (Q3) through a capacitor (C9);
   an induction signal of the second human body induction device (PIR2) is output from the collector after being amplified by a second transistor (Q2) and is then added to the base of the third transistor (Q3) through a capacitor (C10) to be superimposed on the induction signal of the first human body induction signal (PIR1).

8. The device according to claim 6, wherein the dimming control unit (11) outputs and transmits the composite signal from the terminal (VSS2) of the human body induction unit (10) to one pin of the control chip (U4), an A/D conversion unit in the control chip (U4) converts an analog voltage signal into a digital signal and then transmits the digital signal to a PWM duty cycle signal generation unit in the control chip (U4), and the PWM duty cycle signal generation unit outputs different PWM duty cycle signals.

9. The device according to claim 6, wherein a signal from a light-control device (PT1) is input to another pin of the control chip (U4), and a voltage comparator is arranged in the control chip (U4); a threshold is set; an output of the voltage comparator is connected to a source of a transistor (Q4); the transistor (Q4) is turned on when an illumination lamp needs to be turned on in a night mode; and the transistor (Q4) is turned off in a daytime mode.

10. The device according to claim 6, wherein the human body induction unit (10) is an independent module, and in this case, a second terminal (VDD2), a third terminal (CDS2), the terminal (VSS2), a fourth terminal (GND2) and a fifth terminal (LED2) of the human body induction unit respectively correspond to a sixth terminal (VDD1), a seventh terminal (CDS1), an eighth terminal (VSS1), a ninth terminal (GND1) and a tenth terminal (LED1) of the LED lamp power supply main circuit; or the human body induction unit (10) and the LED lamp power supply main circuit are integrated, and in this case, (VDD2) is directly connected with (VDD1), (CDS2) is directly connected with (CDS1), (VSS2) is directly connected with (VSS1), (GND2) is directly connected with (GND1), and (LED2) is directly connected with (LED1).

* * * * *